(12) United States Patent
Shi et al.

(10) Patent No.: US 7,057,421 B2
(45) Date of Patent: Jun. 6, 2006

(54) FLIPFLOP

(75) Inventors: Bingxue Shi, Beijing (CN); Baoyong Chi, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/829,262

(22) Filed: Apr. 22, 2004

(65) Prior Publication Data

US 2005/0237096 A1    Oct. 27, 2005

(51) Int. Cl.
    *G01R 19/00*    (2006.01)
(52) U.S. Cl. .......................... 327/55; 327/57; 365/205
(58) Field of Classification Search ............ 327/51–57
    See application file for complete search history.

(56) References Cited

U.S. PATENT DOCUMENTS 6,201,418 B1 * 3/2001 Allmon ...................... 327/52
6,310,501 B1 * 10/2001 Yamashita ................... 327/215
6,396,309 B1 * 5/2002 Zhao et al. .................... 327/55
6,885,222 B1 * 4/2005 Sato ............................ 327/55

* cited by examiner

*Primary Examiner*—Tuan T. Lam
(74) *Attorney, Agent, or Firm*—Birch, Stewart, Kolasch & Birch, LLP

(57) ABSTRACT

A flipflop. In the flipflop, a differential pair is coupled to two input signals inverse to each other. A first latch unit is connected to the differential pair in parallel, and includes a first node and a second node coupled to generate complementary latch signals according to the first and second data signals. A signal amplification circuit is coupled to the differential pair and the first latch unit to generate complementary amplified signals according to the complementary latch signals. A second latch unit is coupled to the signal amplifier circuit to generate complementary static output signals according to the complementary amplified signals and to maintain the complementary static output signals.

15 Claims, 4 Drawing Sheets

FLIPFLOP

BACKGROUND OF THE INVENTION

1. Field of the Invention

The present invention relates to a logic circuit, and more particularly to a flipflop.

2. Description of the Related Art

Flipflops are basic units for integrated circuits (ICs), of which performance has a significant effect on performance thereof. Many kinds of flipflops have developed among which sense amplifier-based flipflops have received focus. FIG. 1 shows a conventional flipflop 10 composed of 24 transistors, which cause signal variations resulting serious logic errors during application.

SUMMARY OF THE INVENTION

It is therefore an object of the present invention to improve the speed of flipflops.

Another objection of the present invention is to reduce the number of transistors required in the flipflops, and thus, reduce required chip area.

Another objection of the present invention is to eliminate signal variations inherent in existing flipflop structure.

According to the above mentioned objects, the present invention provides a flipflop in which a differential pair is coupled to two inverse input signals. A first latch unit is connected to the differential pair in parallel, and includes a first node and a second node coupled to generate complementary latch signals according to the first and second data signals. A signal amplification circuit is coupled to the differential pair and the first latch unit to generate complementary amplified signals according to the complementary latch signals. A second latch unit is coupled to the signal amplifier circuit to generate complementary static output signals according to the complementary amplified signals and to maintain the complementary static output signals.

According to the above mentioned objects, the present invention also provides another flipflop. In the flipflop, a first transistor includes a first terminal coupled to a first voltage, and a second terminal coupled to a first node. A second transistor includes a first terminal coupled to the first node, a control terminal coupled to a control terminal of the first transistor, and a second terminal coupled to a common node. A third transistor is coupled between the first voltage and the first node. A fourth transistor is coupled between the first node and the common node, and includes a control terminal coupled to a first input signal. A fifth transistor includes a first terminal coupled to the first voltage, a second terminal coupled to a second node, and a control terminal coupled to the first node. A sixth transistor includes a control terminal coupled to the control terminal of the fifth transistor, a first terminal coupled to the second node and the control terminal of the first transistor, and a second terminal coupled to the common node. A seventh transistor is coupled between the first voltage and the second node. An eighth transistor is coupled between the second node and the common node, and includes a control terminal coupled to a second input signal. The first input signal is the inverse of the second input signal. A ninth transistor is coupled between the common node and a second voltage, and control terminals of the third, seventh and ninth transistors are coupled to a control signal. A signal amplification circuit includes two input terminals coupled to the first and second nodes respectively, a first control terminal coupled to the control terminal, a second control terminal and a third control terminal respectively coupled to the second and first input signals, a first output terminal and a second output terminal. Two cross-coupled inverters include input terminals coupled to the first and second output terminals of the signal amplification circuit.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

First Embodiment

Figure 2:
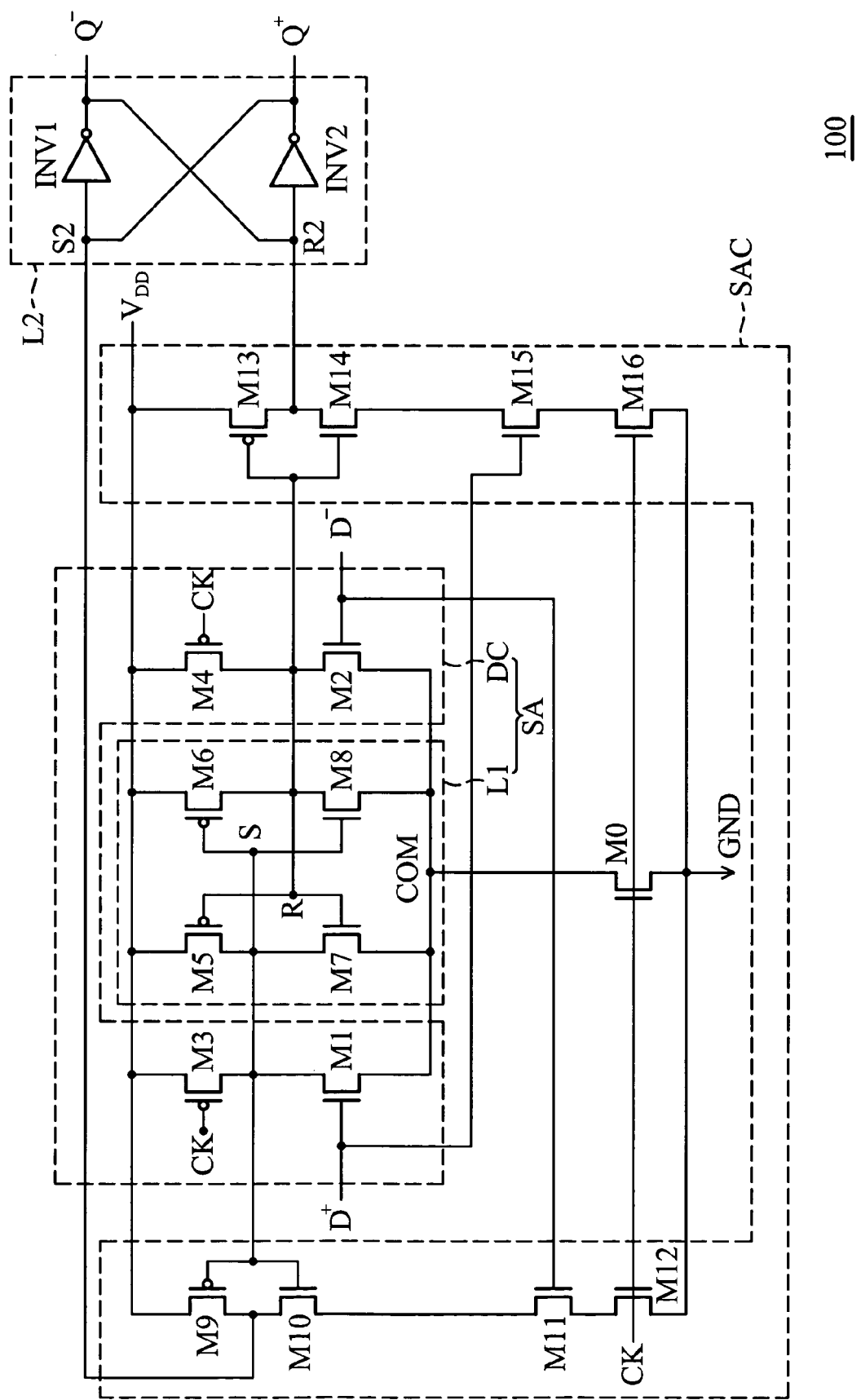
FIG. 2 is a diagram of a flipflop according to a first embodiment of the present invention.

FIG. 2 is a circuit diagram according to a first embodiment of the present invention. As shown in FIG. 2, the flipflop 100 comprises a sense amplifier SA, a current source transistor M0, a signal amplification circuit SAC and a second latch unit L2.

The sense amplifier SA receives two input signals D+ and D− and outputs complementary latch signals. The sense amplifier SA includes a first latch unit L1 and a differential circuit DC. The first latch unit L1 is coupled between a first voltage VDD and a common node COM, and includes a first latch unit L1 with a first node S and a second node R to output complementary latch signals, wherein the complementary latch signals are the voltage levels at the node S and R respectively. The differential circuit DC is connected to the first latch unit L1 in parallel, and includes a differential pair composed of transistors M1 and M2 and two charge transistors M3 and M4. Control terminals of the transistors M1 and M2 are coupled to the input terminals D+ and D−, and the input terminals D+ and D− are the inverse of each other. A current source transistor M0 is coupled to the sense amplifier SA and a second voltage GND, includes a first terminal coupled to the common node COM, a second terminal coupled to the second voltage GND, and a control terminal coupled to a control signal CK.

The differential circuit DC includes a differential pair composed of transistors M1 and M2 receiving the input signals D+ and D−, and two charge transistors M3 and M4. As shown in FIG. 2, the transistor M3 is coupled between the first voltage VDD and the node S of the first latch unit L1, the transistor M4 is coupled between the first voltage VDD and the node R of the first latch unit L1, and the control terminals of the transistors M3 and M4 are coupled to the control signal CK. The transistor M1 is coupled between the node S and the common node COM, the transistor M2 is coupled between the node R and the common node COM, the control terminals of the transistors M1 and M2 are coupled to the input signals D+ and D– respectively.

In this embodiment, the first latch unit L1 includes two cross-coupled inverters to generate complementary latch signals according to the differential circuit DC and the input signals D+ and D–, wherein the complementary latch signals are the voltage level at the nodes S and R respectively. The first latch unit L1 can be implemented by two cross-coupled inverters. As shown in FIG. 2, the first latch unit L1 includes the transistors M5~M8, wherein the transistors M5 and M7 constitute an inverter and the transistors M6 and M8 constitute another inverter. The transistor M5 includes a first terminal and a second terminal coupled to the first voltage VDD and the node S respectively. The transistor M7 includes a first terminal and a second terminal coupled to the node S and the common node COM respectively. The control terminals of the transistors M5 and M7 are coupled to the node S. In addition, the transistor M6 includes a first terminal and a second terminal coupled to the first voltage VDD and the node R respectively. The transistor M8 includes a first terminal and a second terminal coupled to the node R and the common node COM respectively. The control terminals of the transistors M6 and M8 are coupled to the node S.

The signal amplification circuit SAC includes two input terminals coupled to the nodes S and R, a first control terminal coupled to the control signal CK, a second control terminal coupled to the control terminal of the transistor M2 and the input signal D–, and a third control terminal coupled to the control terminal of the transistor M1 and the input signal D+. The signal amplification circuit SAC generates complementary amplified signals according to the complementary latch signals at the nodes S and R.

In this embodiment, the signal amplification circuit SAC includes an inverter composed of transistors M9 and M10, another inverter composed of transistors M13 and M14, and transistors M11, M12, M15 and M16. The transistor M9 includes a first terminal coupled to the first voltage VDD, a second terminal as an first output terminal coupled to the node S2 of the second latch unit L2, and a control terminal coupled to the node S of the first latch unit L1. The transistor M10 includes a first terminal coupled to the second terminal of the transistor M9, and a control terminal coupled to the first node S of the first latch unit L1 and the control terminal of the transistor M9. The transistor M11 includes a first terminal coupled to the second terminal of the transistor M10, and a control terminal coupled to the control terminal of the transistor M2, wherein the transistor M11 is controlled by the input signal D–. The transistor M12 is coupled between the second voltage GND and the second terminal of the transistor M11, and includes a control terminal coupled to the control signal CK. Similarly, the transistor M13 includes a first terminal coupled to the first voltage VDD, a second terminal as a second output terminal coupled to the node R2 of the second latch unit L2, and a control terminal coupled to the node R of the first latch unit L1. The transistor M14 includes a first terminal coupled to the second terminal of the transistor M13, and a control terminal coupled to the node R of the first latch unit L1 and the control terminal of the transistor M13. The transistor M15 includes a first terminal coupled to the second terminal of the transistor M14, and a control terminal coupled to the control terminal of the transistor M1, wherein the transistor M15 is controlled by the input signal D+. The transistor M16 is coupled between the second terminal of the transistor M15 and the second voltage GND, and includes a control terminal coupled to the control signal CK. In this case, the complementary amplified signals are the voltage levels at the drain terminals of the transistors M9 and M13 respectively.

The second latch unit L2 includes nodes S2 and R2 coupled to the signal amplification circuit SAC to generate complementary static output signals according to the complementary amplified signals and maintain the complementary static output signals. In this embodiment, the second latch unit L2 includes inverters INV1 and INV2. The input terminal of the inverter INV1 is coupled to the output terminal of the inverter INV2, and the connected node thereof serves as the node S2 of the second latch unit L2. The input terminal of the inverter INV2 is coupled to the output terminal of the inverter INV1, and the connected node thereof serves as the node R2 of the second latch unit L2. In this case, the complementary static output signals are the voltage levels at the output terminals Q– and Q+ of the second latch unit L2.

Operations of the flipflop 100 are described as following.

The transistors M3 and M4 are turned on such that the nodes S and R are charged to logic 1, when the control signal CK is logic 0. The transistors M3 and M4 are turned off at the rise of the control signal CK, such that the transistors M0, M1, M6, M7, M9, M12, M14, M15 and M16 are turned on and the transistors M2, M5, M8, M10, M11 and M13 are turned off if the input signal D+ is logic 1 and the input signal D– is logic 0. Consequently, the voltage level at node S changes from logic 1 to logic 0 while the voltage level at node R remains at logic 1. Thus, the voltage level at the output terminal Q+ is pulled up to logic 1 while the voltage level at the output terminal Q– is pulled down to logic 0. On the contrary, the transistors M3 and M4 are turned off at the rise of the control signal CK, such that the transistors M0, M1, M6, M7, M9, M12, M14, M15 and M16 are turned off and the transistors M2, M5, M8, M10, M11 and M13 are turned on if the input signal D+ is logic 0 and the input signal D– is logic 1. Consequently, the voltage level at node R changes from logic 1 to logic 0 while the voltage level at node S remains at logic 1. Thus, the voltage level at the output terminal Q– is pulled up to logic 1 while the voltage level at the output terminal Q+ is pulled down to logic 0. When the control signal CK changes to logic 0, the nodes S and R are charged to logic 1 and the transistors M9~M16 are turned off such that voltage level (complementary static output signals) at output terminals Q+ and Q– can be latched.

Second Embodiment

Figure 3:
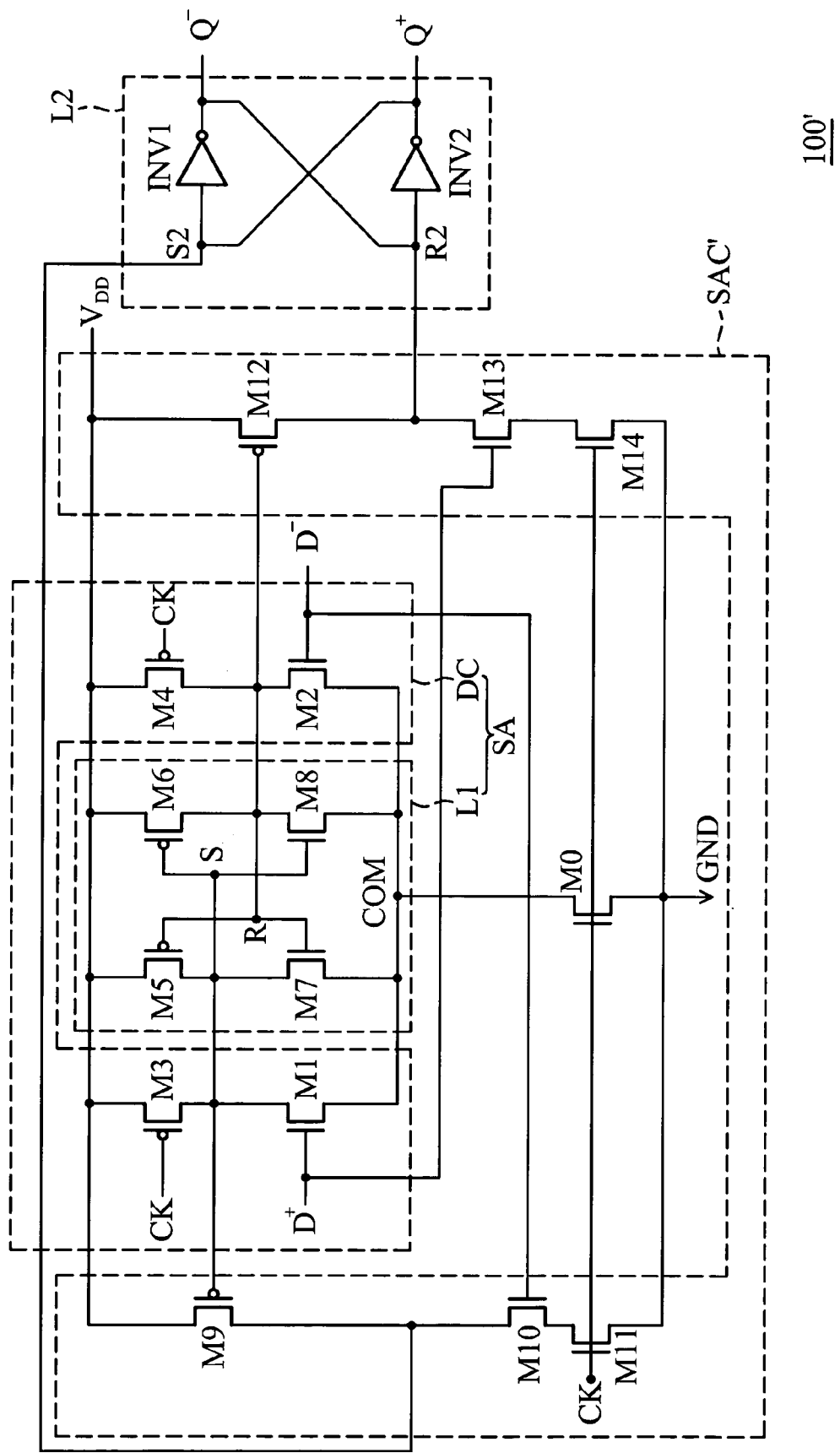
FIG. 3 is a diagram of a flipflop according to a second embodiment of the present invention.

FIG. 3 is another circuit diagram according to a second embodiment of the present invention. As shown in FIG. 3, the flipflop 100' is similar to the flipflop 10 except for the signal amplification circuit SAC' use of pseudo-PMOS dynamic technique, thereby further improving the speed of the flipflop. In the flipflop 100', the load of the sense amplifier SA can be lowered due to the pseudo-PMOS dynamic technique such that the speed of the flipflop is improved. For brevity, description of like structures is omitted.

The signal amplification circuit SAC' can be implemented by transistors M9~M14. The transistor M9 includes a first terminal coupled to the first voltage VDD, a second terminal coupled to the node S2 of the second latch unit L2, and a control terminal coupled to the node S of the first latch unit L1. The transistor M10 includes a first terminal coupled to the second terminal of the transistor M9, and a control terminal coupled to the control terminal of the second transistor M2, wherein the transistor M10 is controlled by the input signal D−. The transistor M11 is coupled between the second voltage and the second terminal of the transistor M10, and includes a control terminal coupled to the control signal CK. The transistor M12 includes a first terminal coupled to the first voltage VDD, a second terminal coupled to the node R2 of the second latch unit L2, and a control terminal of the node R of the first latch unit L1. The transistor M13 includes a first terminal coupled to the second terminal of the transistor M12, and a control terminal of the transistor M1, wherein the transistor M13 is controlled by the input signal D+. The transistor M14 is coupled between the second voltage GND and the second terminal of the transistor M13, and includes a control terminal coupled to the control signal CK, wherein the transistors M11 and M14 are controlled by the control signal CK.

Operations of the flipflop 100' are described as following.

The transistors M3 and M4 are turned on such that the nodes S and R are charged to logic 1, when the control signal CK is logic 0. The transistors M3 and M4 are turned off at the rise of the control signal CK, such that the transistors M0, M1, M6, M7, M9, M11, M13 and M14 are turned on and the transistors M2, M5, M8, M10 and M12 are turned off if the input signal D+ is logic 1 and the input signal D− is logic 0. Consequently, the voltage level at node S changes from logic 1 to logic 0 while the voltage level at node R remains at logic 1. Thus, the voltage level at the output terminal Q+ is pulled up to logic 1 while the voltage level at the output terminal Q− is pulled down to logic 0. Conversely, the transistors M3 and M4 are turned off at the rise of the control signal CK, such that the transistors M1, M6, M7, M9 and M13 are turned off and the transistors M0, M2, M5, M8, M10, M11, M12 and M14 are turned on if the input signal D+ is logic 0 and the input signal D− is logic 1. Consequently, the voltage level at node R changes from logic 1 to logic 0 while the voltage level at node S remains at logic 1. Thus, the voltage level at the output terminal Q− is pulled up to logic 1 while the voltage level at the output terminal Q+ is pulled down to logic 0. When the control signal CK is changed to logic 0, the nodes S and R are charged to logic 1 and the transistors M9~M14 are turned off such that voltage level (complementary static output signals) at output terminals Q+ and Q− can be latched.

In the second embodiment, transistors M10 and M13 are added to turn off the discharge path when voltage level at output terminal (Q+ or Q−) charges from logic 0 to logic 1. The voltage level at output terminal (Q+ or Q−) decreases from the first voltage VDD and there is a static current path if the input signals D+ and D− change in the evaluation phase(control signals CK is logic 1). The proper logic operation is ensured by carefully selecting the dimensions of the transistors. Moreover, in high speed applications, dynamic power dissipation due to continuous switching at high frequency dominates and the added static power dissipation is not significant. Consequently, the flipflop 100' is well-suited to radio frequency (RF) applications.

In the first and second embodiments, the bulk node (not shown) of the transistors M1, M2, M7 and M8 are coupled to the second voltage GND such that the source terminals (COM) of the transistors M1, M2, M7 and M8 are charged to logic 1 (VDD) along with the nodes R and S when the control signal CK is logic 0. Consequently, source-to-bulk bias voltage is generated to increase to the threshold voltages of the transistors M1, M2, M7 and M8. This can reduce the charge storage in the common node COM and decrease the voltage level when the transistors M1, M2, M7 and M8 are turned off. Thus, the transition speed of the sense amplifier SA is improved at the rising edge of the control signal CK.

For comparison with the conventional flipflop 10 shown in FIG. 10, HSPICE simulations using BSIM3.1 (Level 49) transistor models for a standard digital process (0.25 UM logic 2.5 V process) are performed for flipflops 10, 100 and 100' under the same conditions, wherein power supply voltage VDD is 2.5 V and the load capacitances at the output nodes are 0.1 pF.

Table 1 shows performance comparison of the flipflops 10, 100 and 100'.

| | Clock-to-output delay (Tco) | | Speed-up factor | Power (µW) | PDP (fJ) | NPDP |
|---|---|---|---|---|---|---|
| | 0 → 1 | 1 → 0 | | | | |
| FF circuit 10 | 243 ps | 228 ps | 1.0 | 862 | 209 | 1.00 |
| FF circuit 100 | 222 ps | 217 ps | 1.10 | 867 | 192 | 0.92 |
| FF circuit 100' | 186 ps | 189 ps | 1.29 | 713 | 135 | 0.65 |

The clock-to-output delays (Tco) are the times that the voltage levels of the output terminals rise to 2.0V and the voltage levels of the output terminals fall to 0.5V after the control signal CK changes to logic 1. The speed-up factor is the worst case of the clock-to-output delay time, which is the larger value of 0→1 and 1→0 transition times. The power consumption, the power-delay product (PDP) and normalized power-delay product (NPDP) are measured when clock signal CK with a clock frequency of 500 MHz and the input signals (D+ and D−) with a frequency of 250 MHz.

Figure 1:
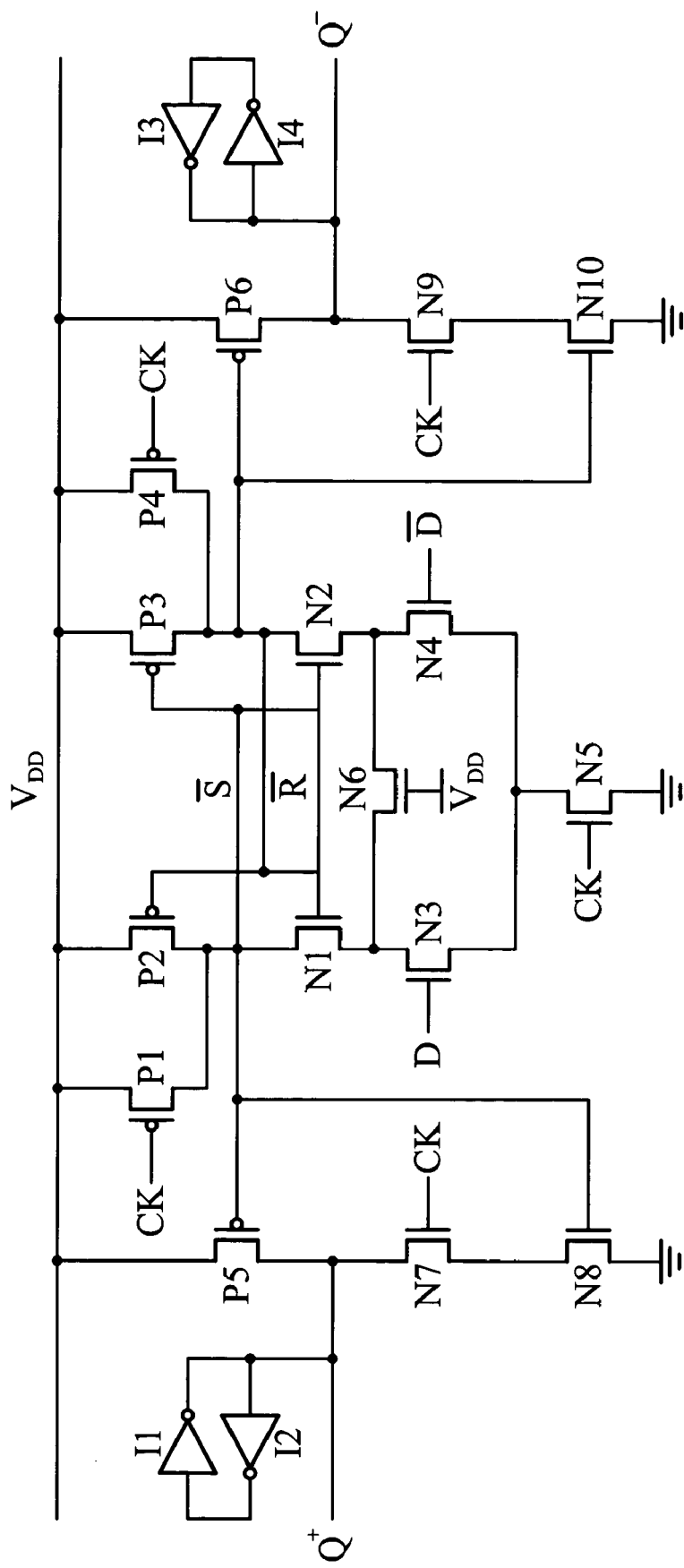
FIG. 1 is a diagram of a conventional flipflop.

In this case, 0→1 and 1→0 transition times of the conventional flipflop are 243 picoseconds (ps) and 228 picoseconds (ps) respectively. Compared to the conventional flipflop 10 shown in FIG. 1, the flipflop 100 of the present invention presents, 0→1 and 1→0 transition times of 222 picoseconds (ps) and 217 picoseconds (ps) respectively, a speed factor of 1.10, power consumption is approximately the same, and the power-delay product (PDP) is reduced by 8%. Similarly, the flipflop 100' of the present invention present 0→1 and 1→0 transition times of 186 picoseconds (ps) and 189 picoseconds (ps) respectively, a speed-up factor 1.29, and power consumption and power-delay product (PDP) are reduced by 17% and 35% respectively. Consequently, the flipflops 100 and 100' are faster than the conventional flipflop 10. Further, while the conventional flipflop 10 needs 21 MOS transistors, the flipflop 100 of the present invention needs only 21 MOS transistors and the flipflop 100' only requires 19 MOS transistors. Consequently, the flipflops 100 and 100' require less chip area than the conventional flipflop 10.

Figure 4:
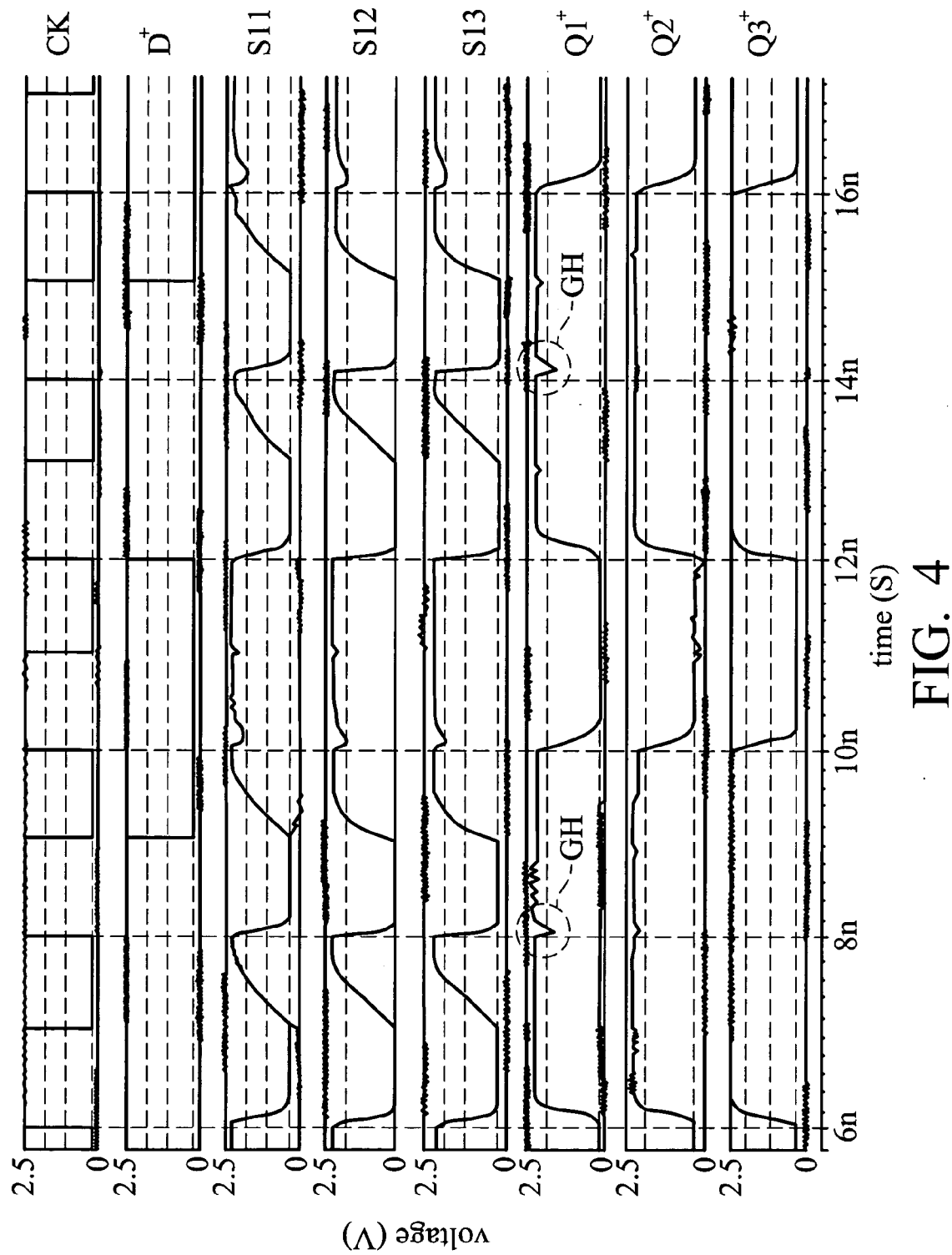
FIG. 4 shows a transient simulation wave of the three flipflops shown in FIG. 1 and those shown in FIGS. 2 and 3.

FIG. 4 shows a transient simulation wave of the three flipflops 10, 100 and 100' with clock signal CK with a clock frequency of 500 MHz and the input signals with a frequency of 500/3 MHZ. CK is the control signal, D+ is the input signal, S11 is the voltage level at the node S of the conventional flipflop 10, and Q1+ is the voltage level of the output terminal Q+ of the conventional flipflop 10. In addition, Q2+ is the voltage level of the output terminal Q+ of the flipflop 100 of the present invention and Q3+ is the voltage level of the output terminal Q+ of the flipflop 100' of the present invention. As shown in FIG. 4, the conventional flipflop 10 may produce signal variations GH, which can result in serious logic error in general applications. Flipflops 100 and 100' of the present invention, however, present no signal variations.

The present invention, accordingly, provides increased speed, requires fewer transistors, and less chip area, and free of signal variations.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flipflop, comprising:
   a differential circuit coupled between a first voltage and a common node, comprising a differential pair having a first transistor and a second transistor, wherein control terminals of the first and second transistors are coupled to a first input signal and a second input signal respectively, and first terminals of the first and second transistors we coupled to the common node;
   a first latch unit coupled between the common node and the first voltage, and connected to the differential pair in parallel, comprising a first node and a second node to respectively coupled to second terminals of the first and second transistors in the differential pair to generate complementary latch signals according to the first and second input signals;
   a signal amplification circuit coupled to the differential circuit and the first latch unit, comprising a first control terminal coupled to a control signal and second and third control terminals coupled to the first input signal and the second input signal respectively, to generate complementary amplified signals according to the complementary latch signals; and
   a second latch unit coupled to the signal amplification circuit to generate complementary static output signals according to the complementary amplified signals and to maintain the complementary static output signals, wherein the first input signal is the inverse of the second input signal.

2. The flipflop as claimed in claim 1, wherein the first Latch unit comprises:
   a first inverter comprising an input terminal coupled to the second node, and an output terminal; and
   a second inverter cross-coupled to the first inverter, comprising an input terminal coupled to the first node and the output terminal of the lint inverter, and an output terminal coupled to the output terminal of the first inverter and the second node.

3. The flipflop as claimed in claim 1, further comprising a current source transistor coupled between the common node and a second voltage, and comprising a control terminal coupled to the control signal.

4. The flipflop as claimed in claim 3, wherein the differential circuit further comprises:
   a third transistor coupled between the first voltage and the first node comprising a control terminal coupled to the control signal; and
   a fourth transistor coupled between the first voltage and the second node comprising a control terminal coupled to the control signal.

5. The flipflop as claimed in claim 4, wherein the second latch unit comprises:
   a third inverter comprising an input terminal and an output terminal; and
   a fourth inverter cross-coupled to the fourth inverter, comprising an input terminal and an output terminal coupled to the output terminal and the input terminal of the third inverter respectively, wherein the input terminals of the third and fourth inverters are coupled to the complementary amplified signals respectively.

6. The flipflop as claimed in claim 5, wherein the signal amplification circuit comprises:
   a fifth inverter coupled to the first voltage and comprising an input terminal coupled to the first node;
   a fifth transistor comprising a first terminal coupled to the fifth inverter a control terminal coupled to the control terminal of the second transistor, and a second terminal;
   a sixth transistor comprising a first terminal coupled to the second terminal of the fifth transistor, a second terminal coupled to the second voltage, and a control terminal coupled to the control signal;
   a sixth inverter coupled to the first voltage and comprising an input terminal coupled to the second node;
   a seventh transistor comprising a first terminal coupled to the sixth inverter, a control terminal coupled to the control terminal of the first transistor, and a second terminal; and
   an eight transistor comprising a first terminal coupled to the second terminal of tile seventh transistor, a control terminal coupled to the control signal, and a second terminal coupled to the second voltage.

7. The flipflop as claimed in claim 5, wherein the signal amplification circuit comprises:
   a fifth transistor comprising a first terminal coupled to the first voltage, a control terminal coupled to first node, and a second terminal;
   a sixth transistor comprising a first terminal coupled to the second terminal of the fifth transistor, a control terminal coupled to the control terminal of the second transistor, and a second terminal;
   a seventh transistor comprising a first terminal coupled to the second terminal of the sixth transistor, a second terminal coupled to the second voltage and a control terminal coupled to the control signal;
   an eighth transistor comprising a first terminal coupled to the first voltage, a control terminal coupled to the second node, and a second terminal;
   a ninth transistor comprising a first terminal coupled to the second terminal coupled to the eighth transistor, a control terminal coupled to the control terminal of the first transistor, and a second terminal; and
   a tenth transistor comprising a first terminal coupled to the second terminal of the ninth transistor, a control terminal coupled to the control signal and a second terminal coupled to the second voltage.

8. A flipflop, comprising:
   a sense amplifier receiving two input signals and outputting complementary latch signals, comprising:
   a first latch unit coupled between a common node and a first voltage, comprising a first inverter and a second inverter cross-coupled to each other, and comprising a first node and a second node to output the complementary latch signals respectively, wherein the first inverter comprises an input terminal coupled to an output terminal of the second inverter, serving as the second node, and an output terminal coupled to an input terminal of the second inverter, serving as the first node; and a differential circuit coupled between the first voltage and the common node and connected to the first latch unit in parallel, comprising a differential pair having a first transistor and a second transistor, wherein control terminals of the first and second transistors are coupled to the two input signal respectively, first terminals of the first and second transistors are coupled to the first node and the second node of the first latch unit respectively and second terminals of the first and second transistors are coupled the common node together;

a signal amplification circuit comprising two input terminals coupled to the first node and the second node respectively, a first control terminal coupled to a control signal, and two output terminals; and a second latch unit comprising a third node and a fourth node coupled to the two output terminals of the signal amplification circuit, wherein the differential circuit further comprises a third transistor coupled between the first voltage and the first node of the first latch unit, and comprising a control terminal coupled to the control signal; and a fourth transistor coupled between the first voltage and the second node of the first latch unit, and comprising a control terminal coupled to the control signal.

9. The flipflop as claimed in claim 8, further comprising a current source transistor coupled between the common node and a second voltage, and comprising a control terminal coupled to the control signal.

10. The flipflop as claimed in claim 8, wherein the second latch unit comprises:
   a third inverter comprising an input terminal and an output terminal; and
   a fourth inverter cross-coupled to the third inverter, comprising an input terminal coupled to the output terminal of the third inverter, serving as the fourth nod; and an output terminal coupled to the input terminal of the third inverter, serving as the third node.

11. The flipflop as claimed in claim 10, wherein the signal amplification circuit comprises:
   a fifth inverter coupled to the first voltage, comprising an input terminal coupled to the first node and an output terminal coupled to the third node;
   a fifth transistor comprising a first terminal coupled to the fifth inverter, a control terminal coupled to the control terminal of the second transistor, and a second terminal;
   a sixth transistor comprising a first terminal coupled to the second terminal of the fifth transistor, a second terminal coupled to the second voltage, and a control terminal coupled to the control signal;
   a sixth inverter coupled to the first voltage, comprising an input terminal coupled to the second node and an output terminal coupled to the fourth node;
   a seventh transistor comprising a first terminal coupled to the sixth inverter, a control terminal coupled to the control terminal of the first transistor, and a second terminal; and
   an eighth transistor comprising a first terminal coupled to the second terminal of the seventh transistor, a control terminal coupled to the control signal, and a second terminal coupled to the second voltage.

12. The flipflop as claimed in claim 10, wherein the signal amplification circuit comprises:

a fifth transistor comprising a first terminal coupled to the first voltage, a control terminal coupled to first node, and a second terminal coupled to the third node;

a sixth transistor comprising a first terminal coupled to the second terminal of the fifth transistor, a control terminal coupled to the control terminal of the second transistor, and a second terminal;

a seventh transistor comprising a first terminal coupled to the second terminal of the sixth transistor, a second terminal coupled to the second voltage and a control terminal coupled to the control signal;

an eighth transistor comprising a first terminal coupled to the first voltage, a control terminal coupled to the second node, and a second terminal coupled to the fourth node;

a ninth transistor comprising a first terminal coupled to the second terminal coupled to the eighth transistor, a control terminal coupled to the control terminal of the first transistor, and a second terminal; and a tenth transistor comprising a first terminal coupled to the second terminal of the ninth transistor, a control terminal coupled to the control signal and a second terminal coupled to the second voltage.

13. A flipflop, comprising:

a first transistor comprising a first terminal coupled to a first voltage, a second terminal coupled to a first node, and a control terminal;

a second transistor comprising a first terminal coupled to the first node, a control terminal coupled to the control terminal of the first transistor, and a second terminal coupled to a common node;

a third transistor coupled between the first voltage and the first node;

a fourth transistor coupled between the first node and the common node, comprising a control terminal coupled to a first input signal;

a fifth transistor comprising a first terminal coupled to the first voltage, a second terminal coupled to a second node, and a control terminal coupled to the first node;

a sixth transistor comprising a control terminal coupled to the control terminal of the fifth transistor, a first terminal coupled to the second node and the control terminal of the first transistor, and a second terminal coupled to the common node;

a seventh transistor coupled between the first voltage and the second node;

an eighth transistor coupled between the second node and the common node, comprising a control terminal coupled to a second input signal, wherein the first input signal is inverse of the second input signal;

a ninth transistor coupled between the common node and a second voltage, wherein control terminals of the third, seventh and ninth transistors are coupled to a control signal;

a signal amplification circuit comprising two input terminals coupled to the first and second node respectively, a first control terminal coupled to the control terminal, a second control terminal and a third control terminal respectively coupled to the second and first input signals, a first output terminal and a second output terminal;

a first inverter comprising an input terminal coupled to the first output terminal of the signal amplification circuit, and an output terminal; and a second inverter comprising an input terminal coupled to the second output terminal of the signal amplification circuit, and an output terminal coupled to the output terminal coupled to the output terminal of the first inverter.

14. The flipflop as claimed in claim 13, the signal amplification circuit comprising;
   a tenth transistor comprising a first terminal coupled to the first voltage, a control terminal coupled to the first node, a second terminal as the first output terminal coupled to the input terminal of the first inverter;
   an eleventh transistor comprising a first terminal coupled to the second terminal of the tenth transistor, a control terminal coupled to the control terminal of first node, and a second terminal;
   a twelfth transistor comprising a first terminal coupled to the second terminal of the eleventh transistor, a control terminal coupled to the second input signal, and a second terminal;
   a thirteenth transistor coupled between the second terminal of the twelfth transistor and the second voltage;
   a fourteenth transistor comprising a first terminal coupled to the first voltage, a control terminal coupled to the second node, and a second terminal as the second output terminal coupled to the input terminal of the second inverter;
   a fifteenth transistor comprising a first terminal coupled to the second terminal of the fourteenth transistor, a control terminal coupled to the second node, and a second terminal;
   a sixteenth transistor comprising a first terminal coupled to the second terminal of the fifteenth transistor, a control terminal coupled to the first input signal, and a second terminal; and
   a seventeenth transistor coupled between the second terminal of the sixteenth transistor and the second voltage, control terminals of the thirteenth and seventeenth transistors, as the first control terminal of the signal amplification circuit, coupled to the control terminal.

15. The flipflop as claimed in claim 13, the signal amplification circuit comprising:
   a tenth transistor comprising a first terminal coupled to the first voltage, a control terminal coupled to the first node, and second terminal as the first output terminal coupled to the input terminal of the first inverter;
   an eleventh transistor comprising a first terminal coupled to the second terminal of the tenth transistor, a control terminal coupled to the second input signal, and a second terminal;
   a twelfth transistor coupled between the second terminal of the eleventh transistor and the second voltage;
   a thirteenth transistor comprising a first terminal coupled to the first voltage, a control terminal coupled to the second node, and a second terminal as the second output terminal coupled to the input terminal of the second inverter;
   a fourteenth transistor comprising a first terminal coupled to the second terminal of the thirteenth transistor, a control coupled to the first input signal, and a second terminal; and
   a fifteenth transistor coupled between the second terminal of the fourteenth transistor and the second voltage, control terminals of the twelfth and fifteenth transistors, as the first control terminal of the signal amplification circuit, coupled to the control signal.

* * * * *